United States Patent
Wang et al.

(10) Patent No.: US 9,734,917 B2
(45) Date of Patent: Aug. 15, 2017

(54) CURRENT BALANCE CIRCUIT AND THE METHOD THEREOF

(71) Applicant: Monolithic Power Systems, Inc., San Jose, CA (US)

(72) Inventors: Xingwei Wang, Chengdu (CN); Junyong Gong, Chengdu (CN); Brent Hughes, Cumming, GA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/194,415

(22) Filed: Jun. 27, 2016

(65) Prior Publication Data
US 2017/0005571 A1   Jan. 5, 2017

(51) Int. Cl.
| | | |
|---|---|---|
| *H03H 11/40* | (2006.01) | |
| *G11C 17/16* | (2006.01) | |
| *H03K 7/08* | (2006.01) | |
| *H03K 5/24* | (2006.01) | |
| *H02M 1/32* | (2007.01) | |
| *H03K 5/1252* | (2006.01) | |
| *H02M 3/158* | (2006.01) | |
| *H02M 3/28* | (2006.01) | |
| *H02J 1/10* | (2006.01) | |

(52) U.S. Cl.
CPC .............. *G11C 17/16* (2013.01); *H02M 1/32* (2013.01); *H03K 5/1252* (2013.01); *H03K 5/24* (2013.01); *H03K 7/08* (2013.01); *H02J 2001/106* (2013.01); *H02M 3/1584* (2013.01); *H02M 3/285* (2013.01)

(58) Field of Classification Search
None
See application file for complete search history.

(56) References Cited

U.S. PATENT DOCUMENTS

| | | | |
|---|---|---|---|
| 8,525,423 B2 | 9/2013 | Yu et al. | |
| 8,957,660 B2* | 2/2015 | Chen | H02M 1/084 323/272 |
| 2009/0167080 A1* | 7/2009 | Carpenter | H02M 3/1584 307/14 |
| 2010/0289424 A1* | 11/2010 | Chang | H05B 33/0818 315/250 |
| 2012/0013187 A1 | 1/2012 | Zhang | |
| 2012/0049741 A1 | 3/2012 | Ye et al. | |
| 2013/0099684 A1* | 4/2013 | Cheng | H05B 33/0818 315/186 |
| 2016/0327917 A1* | 11/2016 | Dickey | H02J 1/10 |

* cited by examiner

*Primary Examiner* — Cassandra Cox
(74) *Attorney, Agent, or Firm* — Perkins Coie LLP

(57) ABSTRACT

A current balance circuit for a power management device having a first current channel and a second current channel, having: a first current sense circuit configured to detect a current flowing through the first current channel, and to provide a first current sense signal indicative of the current flowing through the first current channel; wherein the current balance circuit draws current from the second current channel to the first current channel based on the first current sense signal.

16 Claims, 6 Drawing Sheets

CURRENT BALANCE CIRCUIT AND THE METHOD THEREOF

CROSS-REFERENCE TO RELATED APPLICATIONS

This application claims priority to and the benefit of Chinese Patent Application No. 201510374708.8, filed on Jun. 30, 2015, which is incorporated herein by reference in its entirety.

FIELD

The present invention relates generally to electronic circuits, and more particularly but not exclusively to current balance circuits and the method thereof.

BACKGROUND

In a system with strict requirements to the quality of power supplies, for example, HHD (Hard Disk Drive) system or SSD (Solid State Disk) system, Efuse power devices are needed as power management devices between the power supplies and post-stage circuits. As shown in FIG. 1, a double-channel Efuse power device 10 providing 5V power supply and 12V power supply is commonly applied in the field. Both current channels r1 and r2 have a power limit of 4.5 W. But in the application, 5V power supply is more widely used which results in overload of the current channel r1 providing 5V power supply.

As a result, there is a need for supplying extra needed power to current channel r1 to meet heavy load requirements.

SUMMARY

It is an object of the present invention to provide a current balance circuit for distributing current between the current channels of a double channel Efuse power device. The double channel Efuse power device comprises two current channels, wherein each current channel provides a load current to a load. When one of the current channels is overloaded, i.e., the power provided by the current channel exceeds a preset limit, extra current is drawn from the other current channel, via the current balance circuit, to meet the heavy load requirements.

In accomplishing the above and other objects, there has been provided, in accordance with an embodiment of the present invention, a current balance circuit for a power management device having a first current channel and a second current channel, comprising: a current balance circuit for a power management device having a first current channel and a second current channel, comprising: a first terminal coupled to an input terminal of the first current channel; a second terminal coupled to an input terminal of the second current channel; a third terminal coupled to an output terminal of the first current channel; and a fourth terminal coupled to an output terminal of the second current channel; a first current sense circuit having an input terminal coupled to the input terminal of the first current channel to detect a current flowing through the first current channel, and an output terminal configured to provide a first current sense signal indicative of the current flowing through the first current channel; wherein the current balance circuit draws current from the second current channel to the first current channel based on the first current sense signal.

In accomplishing the above and other objects, there has been provided, in accordance with an embodiment of the present invention, an Efuse power device comprising a first current channel, a second current channel, and a current balance circuit, wherein each current channel comprises an Efuse unit, and wherein the current balance circuit comprises: a first current sense circuit having an input terminal coupled to an input terminal of the first current channel to detect a current flowing through the first current channel, and an output terminal configured to provide a first current sense signal indicative of the current flowing through the first current channel; a second current sense circuit having an input terminal coupled to an input terminal of the second current channel to detect a current flowing through the second current channel, and an output terminal configured to provide a second current sense signal indicative of the current flowing through the second current channel; a balance control circuit having a first input terminal coupled to the output terminal of the first current sense circuit to receive the first current sense signal, a second input terminal coupled to the output terminal of the second current sense circuit to receive the second current sense signal, and an output terminal configured to provide a first balance control signal indicating a load condition of the first current channel and the second current channel based on the first current sense signal and the second current sense signal; a buck converter having a power switch, wherein the power switch has a control terminal configured to receive a power control signal, a first terminal coupled to the output terminal of the first current channel, and a second terminal coupled to the output terminal of the second current channel; and a PWM circuit having an input terminal coupled to the balance control circuit to receive the first balance control signal, a current sense terminal configured to receive a current control signal indicative of a current flowing through the power switch of the buck converter, and an output terminal configured to provide the power control signal based on the first balance control signal and the current control signal; wherein the power switch of the buck converter is turned on and off by the power control signal to regulate a current flowing from the second current channel to the first current channel.

In accomplishing the above and other objects, there has been provided, in accordance with an embodiment of the present invention, a control method used with a power management device having dual current channel, comprising: detecting a current flowing through a first current channel; detecting a current flowing through a second current channel; drawing a current from the second current channel to the first current channel when the first current channel is overloaded; and stopping drawing the current from the second current channel when the second current channel is overloaded.

The presented current balance circuits draw current from a current channel with relatively light load to an overloaded current channel, so as to effectively improve utilization of the power supplies to the power management devices, and to alleviate a power limit of the load circuits to further simplify the design of the load circuits.

The use of the same reference label in different drawings indicates the same or like components.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
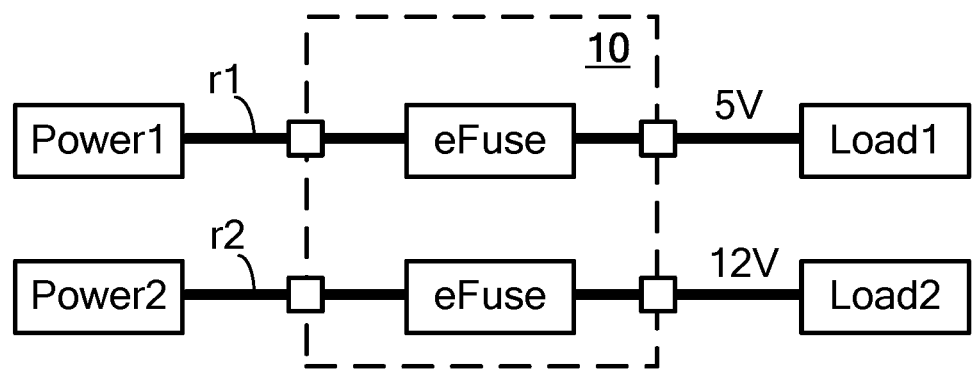
FIG. 1 schematically shows a prior art power management device 10.
Figure 2:
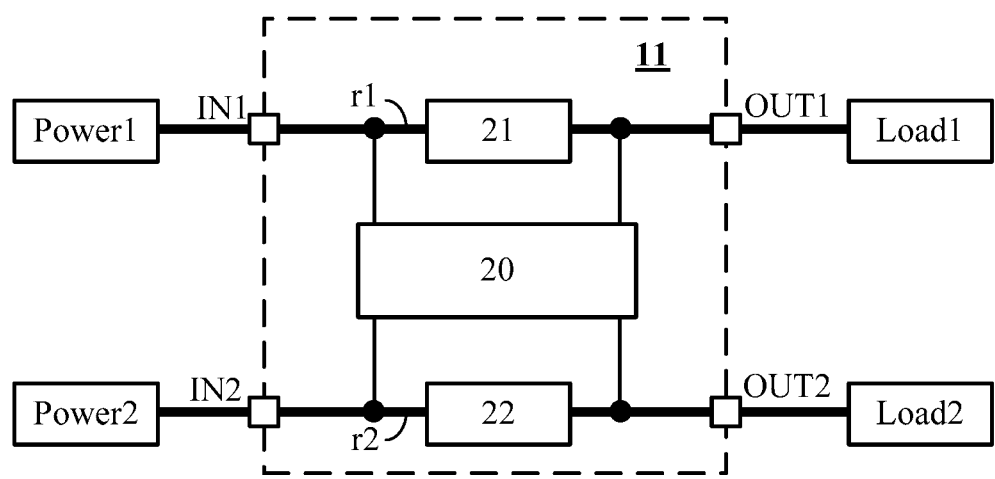
FIG. 2 schematically shows a power management device 20 in accordance with an embodiment of the present invention.

FIG. 2 schematically shows a power management device 11 in accordance with an embodiment of the present invention. As shown in FIG. 2, the power management device 11 comprises a first current channel r1, a second current channel r2 and a current balance circuit 20. In one embodiment, the first current channel r1 comprises a first Efuse unit 21, and the second current channel r2 comprises a second Efuse unit 22. The current balance circuit 20 and the Efuse units 21 and 22 may be integrated in one package. In the example of FIG. 2, the current balance circuit 20 comprises: a first terminal coupled to an input terminal IN1 of the first current channel r1; a second terminal coupled to an input terminal IN2 of the second current channel r2; a third terminal coupled to an output terminal OUT1 of the first current channel r1; and a fourth terminal coupled to an output terminal OUT2 of the second current channel r2; wherein the current balance circuit draws current from the second current channel to the first current channel whenever the first current channel is overloaded.

In one embodiment, the Efuse unit in the first current channel r1 or the second current channel r2 may be replaced by other type of fuse devices.

Figure 3:
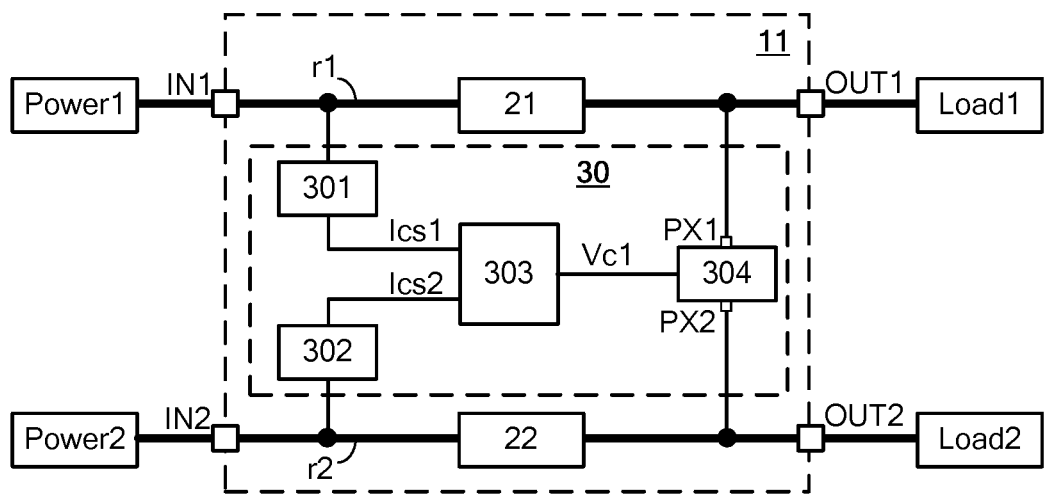
FIG. 3 schematically shows a current balance circuit 30 in accordance with an embodiment of the present invention.

FIG. 3 schematically shows a current balance circuit 30 in accordance with an embodiment of the present invention. The current balance circuit 30 may be used with the power management device 11 having the first current channel r1 and the second current channel r2. As shown in FIG. 3, the current balance circuit 30 comprises: a first current sense circuit 301 having an input terminal coupled to the input terminal IN1 of the first current channel r1 to detect a current flowing through the first current channel r1, and an output terminal configured to provide a first current sense signal Ics1 indicative of the current flowing through the first current channel r1; a second current sense circuit 302 having an input terminal coupled to the input terminal IN2 of the second current channel r2 to detect a current flowing through the second current channel r2, and an output terminal configured to provide a second current sense signal Ics2 based on the current flowing through the second current channel r2; a balance control circuit 303 having a first input terminal coupled to the output terminal of the first current sense circuit 301 to receive the first current sense signal Ics1, a second input terminal coupled to the output terminal of the second current sense circuit 302 to receive the second current sense signal Ics2, and an output terminal configured to provide a first balance control signal Vc1 indicating a load condition of the first current channel and the second current channel based on the first current sense signal Ics1 and the second current sense signal Ics2; and a current regulating circuit 304 having a control terminal coupled to the output terminal of the balance control circuit 303 to receive the first balance control signal Vc1, a first terminal PX1 coupled to the output terminal OUT1 of the first current channel r1, a second terminal PX2 coupled to the output terminal OUT2 of the second current channel r2, wherein based on the first balance control signal Vc1, the current regulating circuit 304 controls a current transfer between the first current channel r1 and the second current channel r2.

Persons of ordinary skill in the art should know that known circuits used to detect the current flowing through the current channels may also be used as the current sense circuit without detracting from the merit of the present invention.

In one embodiment, the first current channel r1 provides a power supply voltage of 5V, and the second current channel r2 provides a power supply voltage of 12V. Persons of ordinary skill in the art should know that the first current channel r1 and the second current channel r2 may provide power supply voltages with other values.

Figure 4:
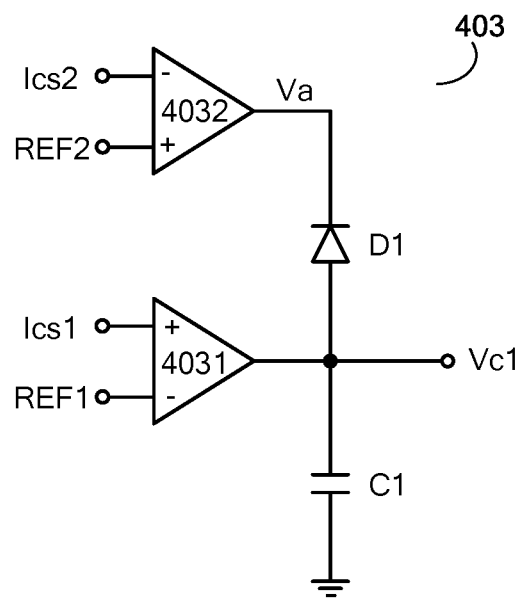
FIG. 4 schematically shows a balance control circuit 403 in accordance with an embodiment of the present invention.

FIG. 4 schematically shows a balance control circuit 403 in accordance with an embodiment of the present invention. The balance control circuit 403 may be used with the current balance circuit in FIG. 3. The balance control circuit 403 comprises: a first amplify circuit 4031 having a first input terminal (non-inverting input terminal) configured to receive the first current sense signal Ics1, a second input terminal (inverting input terminal) configured to receive a first reference signal REF1, and an output terminal configured to provide the first balance control signal Vc1 based on the first current sense signal Ics1 and the first reference signal REF1; a first comparison circuit 4032 having a first input terminal (inverting input terminal) configured to receive the second current sense signal Ics2, a second input terminal (non-inverting input terminal) configured to receive a second reference signal REF2, and an output terminal configured to provide a first discharge control signal Va based on the second current sense signal Ics2 and the second reference signal REF2; a first capacitor C1 coupled between the output terminal of the first amplify circuit 4031 and a ground reference; and a first diode D1 having a first terminal coupled to the output terminal of the first amplify circuit 4031 to receive the first balance control signal Vc1, and a second terminal coupled to the output terminal of the first comparison circuit 4032 to receive the first discharge control signal Va, wherein the first diode is conducted when the first balance control signal Vc1 is larger than the first discharge control signal Va.

In one embodiment, the first amplify circuit 4031 comprises a transconductance amplifier. When the first current sense signal Ics1 is larger than the first reference signal REF1, a current is provided from the transconductance amplifier to charge the first capacitor C1. In one embodiment, the larger the first current sense signal Ics1, the larger the voltage across the first capacitor C1, i.e., the first balance control signal Vc1.

In one embodiment, an anode terminal of the first diode D1 is coupled to the output terminal of the first amplify circuit 4031, and a cathode terminal of the diode D1 is coupled to the output terminal of the first comparison circuit 4032. In one embodiment, the first discharge control signal Va is in a logic low state when the second current sense signal Ics2 is larger than the second reference signal REF2 which indicates that the second current channel r2 is overloaded. During this period, the first balance control signal Vc1 is larger than the first discharge control signal Va and the diode D1 is conducted, resulting in discharging of the first capacitor C1 and decrease of the first balance control signal Vc1.

Figure 5:
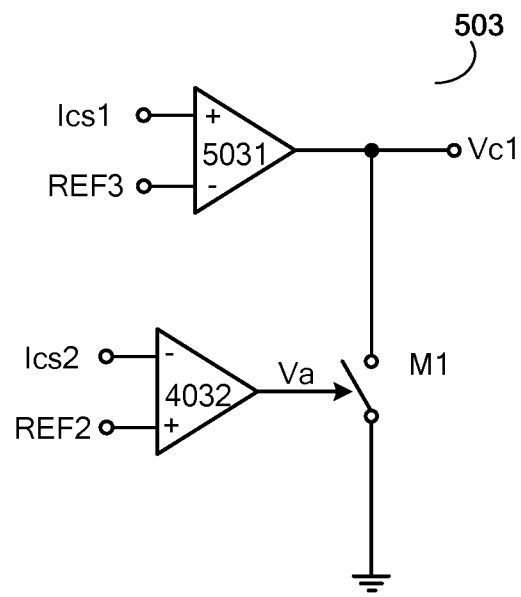
FIG. 5 schematically shows a balance control circuit 503 in accordance with an embodiment of the present invention.

FIG. 5 schematically shows a balance control circuit 503 in accordance with an embodiment of the present invention. The balance control circuit 503 may be used with the current balance circuit 30 in FIG. 3. The balance control circuit 503 comprises: a second amplify circuit 5031 having a first input terminal (non-inverting input terminal) configured to receive the first current sense signal Ics1, a second input terminal (inverting input terminal) configured to receive a third reference signal REF3, and an output terminal configured to provide the first balance control signal Vc1 based on the first current sense signal Ics1 and the third reference signal REF3; the first comparison circuit 4032 having a first input terminal configured to receive the second current sense signal Ics2, a second input terminal configured to receive the second reference signal REF2, and an output terminal configured to provide the first discharge control signal Va; and a first switch M1 having a control terminal coupled to the output terminal of the first comparison circuit 4032 to receive the first discharge control signal Va, a first terminal coupled to the output terminal of the second amplify circuit 5031, and a second terminal coupled to the ground reference, wherein the first switch M1 is turned on and off by the first discharge control signal Va.

In one embodiment, the second amplify circuit 5031 comprises an error amplifier. The first balance control signal Vc1 increases as the first current sense signal Ics1 increases.

In one embodiment, the first discharge control signal Va is in a logic low state when the second current sense signal Ics2 is larger than the second reference signal REF2 which indicates that the second current channel r2 is overloaded. During this period, the first switch M1 is turned on and the first balance control signal Vc1 is pulled to the ground reference.

In one embodiment, the balance control circuit 303 in FIG. 3 may be implemented by charging or discharging a capacitor by a controllable current source controlled by the first current sense signal Ics1 and the second current sense signal Ics2.

Figure 6:
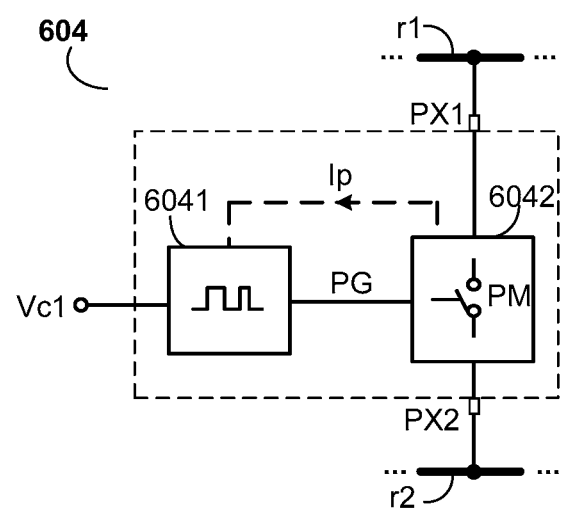
FIG. 6 schematically shows a current regulating circuit 604 in accordance with an embodiment of the present invention.

FIG. 6 schematically shows a current regulating circuit 604 in accordance with an embodiment of the present invention. As shown in FIG. 6, the current regulating circuit 604 comprises: a duty cycle regulating circuit 6041 having an input terminal coupled to the output terminal of the balance control circuit 303 to receive the first balance control signal Vc1, and an output terminal configured to provide a power control signal PG based on the first balance control signal Vc1; and a power circuit 6042 having a power switch PM, wherein the power switch PM has a control terminal configured to receive the power control signal PG, a first terminal PX1 coupled to the first current channel r1, and a second terminal PX2 coupled to the second current channel r2; wherein the power switch PM is turned on and off by the power control signal PG to regulate a current flowing from the second current channel r2 to the first current channel r1.

In one embodiment, when the first balance control signal Vc1 increases as the current of the first current channel r1 increases, the duty cycle of the power control signal PG increases. As a result, the on time of the power switch PM is prolonged, and the current flowing from the second current channel r2 to the first current channel r1 increases.

In one embodiment, the duty cycle regulating circuit 6041 comprises a PWM (Pulse Width Modulation) circuit with voltage loop control.

In one embodiment, the duty cycle regulating circuit 6041 further comprises a current sense terminal configured to receive a current control signal Ip indicative of a current flowing through the power switch PM, wherein based on the current control signal Ip and the first balance control signal Vc1, the duty cycle regulating circuit 6041 provides the power control signal PG at the output terminal. Detecting the current flowing through the power switch of the power circuit 6042 to generate the current control signal Ip is known to persons of ordinary skill in the art, and is not described here for brevity. In one embodiment, the power circuit 6042 may further comprise an inductor.

In one embodiment, the duty cycle regulating circuit 6041 comprises a PWM control circuit with peak current control.

Persons of ordinary skill in the art should know that the duty cycle regulating circuit 6041 may comprise any DC-DC controllers of switching regulators, for example, PWM control circuit, PFM control circuit, COT control circuit and so on.

In one embodiment, when the voltage supply of the first current channel r1 is lower than the voltage supply of the second current channel r2, the power circuit 6042 may comprise step-down voltage converters, e.g., buck converter, flyback converter and so on.

In one embodiment, when the voltage supply of the first current channel r1 is higher than the voltage supply of the second current channel r2, the power circuit may comprise step-up voltage converters, e.g., boost converter.

Figure 7:
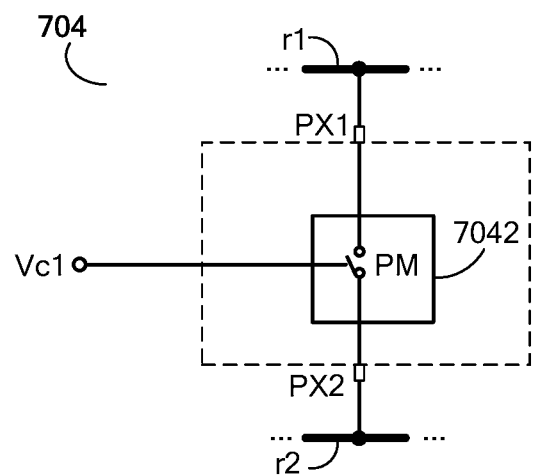
FIG. 7 schematically shows a current regulating circuit 704 in accordance with an embodiment of the present invention.

FIG. 7 schematically shows a current regulating circuit 704 in accordance with an embodiment of the present invention. As shown in FIG. 7, the current regulating circuit 704 comprises: a power circuit 7042 having a power switch PM, wherein the power switch PM has a control terminal configured to receive the first balance control signal Vc1, a first terminal PX1 coupled to the first current channel r1, and a second terminal PX2 coupled to the second current channel r2; wherein the power switch PM is controlled by the first balance control signal Vc1 to regulate a current flowing from the second current channel r2 to the first current channel r1.

In one embodiment, the current regulating circuit 704 comprises LDO (Low Dropout Regulator).

Figure 8:
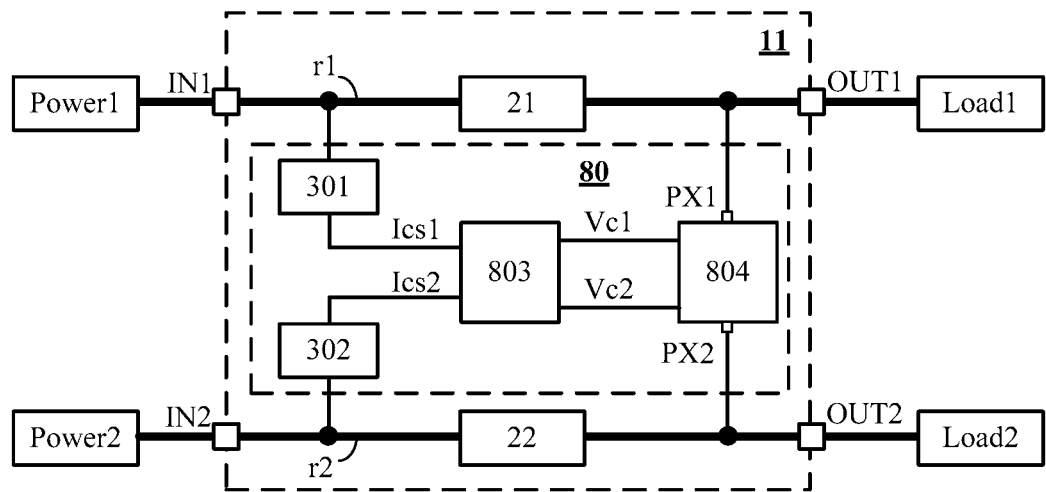
FIG. 8 schematically shows a current balance circuit 80 in accordance with an embodiment of the present invention.

FIG. 8 schematically shows a current balance circuit 80 in accordance with an embodiment of the present invention. The current balance circuit 80 may be used with the power management device 11 having the first current channel r1 and the second current channel r2. As shown in FIG. 8, the current balance circuit 80 comprises: a first current sense circuit 301 having an input terminal coupled to the input terminal IN1 of the first current channel r1 to detect a current flowing through the first current channel r1, and an output terminal configured to provide a first current sense signal Ics1 indicative of the current flowing through the first current channel r1; a second current sense circuit 302 having an input terminal coupled to the input terminal IN2 of the second current channel r2 to detect a current flowing through the second current channel r2, and an output terminal configured to provide a second current sense signal Ics2 based on the current flowing through the second current channel r2; a balance control circuit 803 having a first input terminal coupled to the output terminal of the first current sense circuit 301 to receive the first current sense signal Ics1, a second input terminal coupled to the output terminal of the second current sense circuit 302 to receive the second current sense signal Ics2, a first output terminal and a second output terminal configured to respectively provide a first balance control signal Vc1 and a second balance control signal Vc2 based on the first current sense signal Ics1 and the second current sense signal Ics2; a current regulating circuit 804 having a first control terminal coupled to the first output terminal of the balance control circuit 803 to receive the first balance control signal Vc1, a second control terminal coupled to the second output terminal of the balance control circuit 803 to receive the second balance control signal Vc2, a first terminal PX1 coupled to the output terminal OUT1 of the first current channel r1, a second terminal PX2 coupled to the output terminal OUT2 of the second current channel r2, wherein based on the first balance control signal Vc1 and the second balance control signal Vc2, the current regulating circuit 804 controls a current transferred between the first current channel r1 and the second current channel r2.

Figure 9:
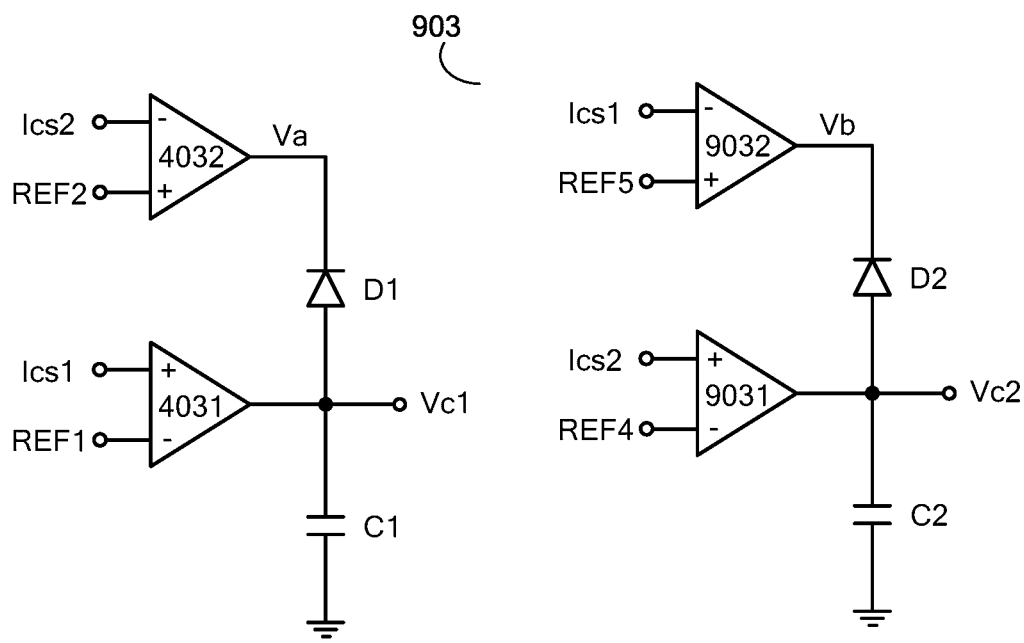
FIG. 9 schematically shows a balance control circuit 903 in accordance with an embodiment of the present invention.

FIG. 9 schematically shows a balance control circuit 903 in accordance with an embodiment of the present invention. The balance control circuit 903 may be used with the current balance circuit 80 in FIG. 8. The balance control circuit 903 comprises: a first amplify circuit 4031 having a first input terminal (non-inverting input terminal) configured to receive the first current sense signal Ics1, a second input terminal (inverting input terminal) configured to receive the first reference signal REF1, and an output terminal configured to provide the first balance control signal Vc1 based on the first reference signal REF1 and the first current sense signal Ics1; a first comparison circuit 4032, having a first input terminal (inverting input terminal) configured to receive the second current sense signal Ics2, a second input terminal (non-inverting input terminal) configured to receive the second reference signal REF2, and an output terminal configured to provide a first discharge control signal Va based on the second current sense signal Ics2 and the second reference signal REF2; a first capacitor C1 coupled between the output terminal of the first amplify circuit 4031 and the ground reference; a first diode D1 having a first terminal coupled to the output terminal of the first amplify circuit 4031 to receive the first balance control signal Vc1, and a second terminal coupled to the output terminal of the first comparison circuit 4032 to receive the first discharge control signal Va, wherein the first diode D1 is conducted when the first balance control signal Vc1 is larger than the first discharge control signal Va; a third amplify circuit 9031 having a first input terminal (non-inverting input terminal) configured to receive the second current sense signal Ics2, a second input terminal (inverting input terminal) configured to receive a fourth reference signal REF4, and an output terminal configured to provide the second balance control signal Vc2 based on the fourth reference signal REF4 and the second current sense signal Ics2; a second comparison circuit 9032, having a first input terminal (inverting input terminal) configured to receive the first current sense signal Ics1, a second input terminal (non-inverting input terminal) configured to receive a fifth reference signal REF5, and an output terminal configured to provide a second discharge control signal Vb based on the first current sense signal Ics1 and the fifth reference signal REF5; a second capacitor C2 coupled between the output terminal of the third amplify circuit 9031 and the ground reference; a second diode D2 having a first terminal coupled to the output terminal of the third amplify circuit 9031 to receive the second balance control signal Vc2, and a second terminal coupled to the output terminal of the second comparison circuit 9032 to receive the second discharge control signal Vb, wherein the second diode D2 is conducted when the second balance control signal Vc2 is larger than the second discharge control signal Vb.

In one embodiment, the first amplify circuit 4031 and the third amplify circuit 9031 comprise transconductance amplifiers. When the first current sense signal Ics1 is larger than the first reference signal REF1, a current is provided from the first amplify circuit 4031 to charge the first capacitor C1. In one embodiment, the larger the first current sense signal Ics1, the larger the voltage across the first capacitor C1, i.e., the first balance control signal Vc1. When the second current sense signal Ics2 is larger than the fourth reference signal REF4, a current is provided from the third amplify circuit 9031 to charge the second capacitor C2. In one embodiment, the larger the second current sense signal Ics2, the larger the voltage across the second capacitor C2, i.e., the second balance control signal Vc2.

In one embodiment, an anode terminal of the second diode D2 is coupled to the output terminal of the third amplify circuit 9031, and a cathode terminal of the second diode D2 is coupled to the output terminal of the second comparison circuit 9032. In one embodiment, the second discharge control signal Vb is in a logic low state when the first current sense signal Ics1 is larger than the fifth reference signal REF5 which indicates that the first current channel r1 is overloaded. During this period, the second balance control signal Vc2 is larger than the second discharge control signal Vb and the second diode D2 is conducted, resulting in the discharging of the second capacitor C2 and the decrease of the second balance control signal Vc2.

Figure 10:
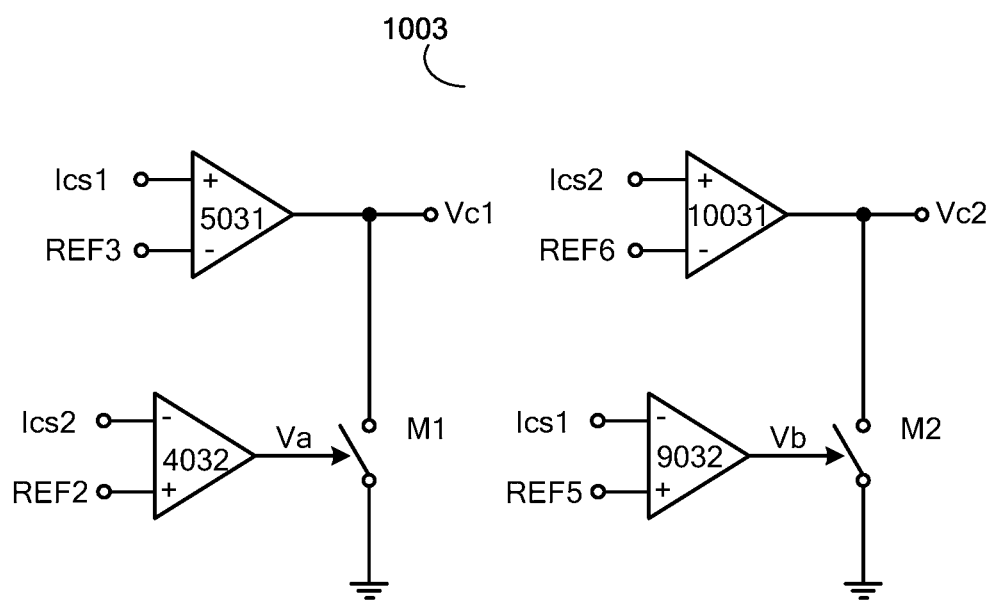
FIG. 10 schematically shows a balance control circuit 1003 in accordance with an embodiment of the present invention.

FIG. 10 schematically shows a balance control circuit 1003 in accordance with an embodiment of the present invention. The balance control circuit 1003 may be used with the current balance circuit in FIG. 9. The balance control circuit 1003 comprises: a second amplify circuit 5031 having a first input terminal (non-inverting input terminal) configured to receive the first current sense signal Ics1, a second input terminal (inverting input terminal) configured to receive a third reference signal REF3, and an output terminal configured to provide the first balance control signal Vc1 based on the first current sense signal Ics1 and the third reference signal REF3; the first comparison circuit 4032 having a first input terminal configured to receive the second current sense signal Ics2, a second input terminal configured to receive the second reference signal REF2, and an output terminal configured to provide the first discharge control signal Va; a first switch M1 having a control terminal coupled to the output terminal of the first comparison circuit 4032 to receive the first discharge control signal Va, a first terminal coupled to the output terminal of the second amplify circuit 5031, and a second terminal coupled to the ground reference, wherein the first switch M1 is turned on and off by the first discharge control signal Va; the fourth amplify circuit 10031 having a first input terminal (non-inverting input terminal) configured to receive the second current sense signal Ics2, a second input terminal (inverting input terminal) configured to receive a sixth reference signal REF6, and an output terminal configured to provide the second balance control signal Vc2 based on the second current sense signal Ics2 and the sixth reference signal REF6; the second comparison circuit 9032 having a first input terminal configured to receive the first current sense signal Ics1, a second input terminal configured to receive the fifth reference signal REF5, and an output terminal configured to provide the second discharge control signal Vb based on the first current sense signal Ics1 and the fifth reference signal REF5; and a second switch M2 having a control terminal coupled to the output terminal of the second comparison circuit 9032 to receive the second discharge control signal Vb, a first terminal coupled to the output terminal of the fourth amplify circuit 10031, and a second terminal coupled to the ground reference, wherein the second switch M2 is turned on and off by the second discharge control signal Vb.

In one embodiment, the fourth amplify circuit 10031 comprises an error amplifier. The second balance control signal Vc2 increases as the second current sense signal Ics2 increases.

In one embodiment, the second discharge control signal Vb is in a logic low state when the first current sense signal Ics1 is larger than the fifth reference signal REF5 which indicates that the first current channel r1 is overloaded. During this period, the second switch M2 is turned on and the second balance control signal Vc2 decreases.

Figure 11:
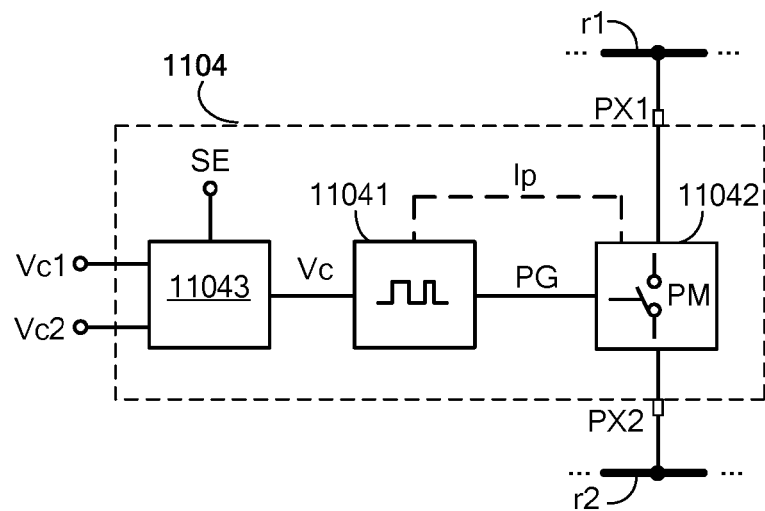
FIG. 11 schematically shows a current regulating circuit 1104 in accordance with an embodiment of the present invention.

FIG. 11 schematically shows a current regulating circuit 1104 in accordance with an embodiment of the present invention. As shown in FIG. 11, the current regulating circuit 1104 comprises: a select circuit 11043 having a control terminal configured to receive a select signal SE, a first input terminal configured to receive the first balance control signal Vc1, a second input terminal configured to receive the second balance control signal Vc2, and an output terminal configured to provide the first balance control signal Vc1 or the second balance control signal Vc2 as a balance control signal Vc according to the select signal SE; a duty cycle regulating circuit 11041 having an input terminal coupled to the output terminal of the select circuit 11043 to receive the balance control signal Vc, and an output terminal configured to provide a power control signal PG based on the balance control signal Vc; and a power circuit 11042 having a power switch PM, wherein the power switch PM has a control terminal configured to receive the power control signal PG, a first terminal PX1 coupled to the first current channel r1, and a second terminal PX2 coupled to the second current channel r2; wherein the power switch PM is turned on and off by the power control signal PG to regulate a current transferred between the first current channel r1 and the second current channel r2.

In one embodiment, the power circuit 11042 comprises a bidirectional switching regulator.

In one embodiment, when the first current channel r1 is overloaded, the select circuit 11043 chooses the first balance control signal Vc1 as the balance control signal Vc. Based on the first balance control signal Vc1, the duty cycle regulating circuit 11041 generates the power control signal PG to control the power circuit 11042 so as to draw current from the second current channel r2 to the first current channel r1.

In one embodiment, when the second current channel r2 is overloaded, the select circuit 11043 chooses the second balance control signal Vc2 as the balance control signal Vc. Based on the second balance control signal Vc2, the duty cycle regulating circuit 11041 generates the power control signal PG to control the power circuit 11042 so as to draw current from the first current channel r1 to the second current channel r2.

In one embodiment, the duty cycle regulating circuit 11041 comprises a PWM voltage regulator with voltage loop control.

In one embodiment, the duty cycle regulating circuit 11041 further comprises a current sense terminal configured to receive a current control signal Ip indicative of a current flowing through the power switch PM, wherein based on the current control signal Ip and the balance control signal Vc, the duty cycle regulating circuit 11041 provides the power control signal PG at the output terminal.

In one embodiment, the duty cycle regulating circuit 11041 comprises a PWM control circuit with peak current control.

Persons of ordinary skill in the art should know that the duty cycle regulating circuit 11041 may comprise any DC-DC controller of switching regulators, for example, PWM control circuit, PFM control circuit, COT control circuit and so on.

In one embodiment, the select signal SE is generated based on the value of the current of the first current channel r1 and the second current channel r2. For example, the select signal SE controls the select circuit 11043 to provide the first balance control signal Vc1 to the duty cycle regulating circuit 11041 when the current of the first current channel r1 increases to a first preset value; and the select signal SE controls the select circuit 11043 to provide the second balance control signal Vc2 to the duty cycle regulating circuit 11041 when the current of the first current channel r2 increases to a second preset value. The select circuit 11043 may be realized by many circuits known to persons of ordinary skill in the art, and is not described here for brevity.

Figure 12:
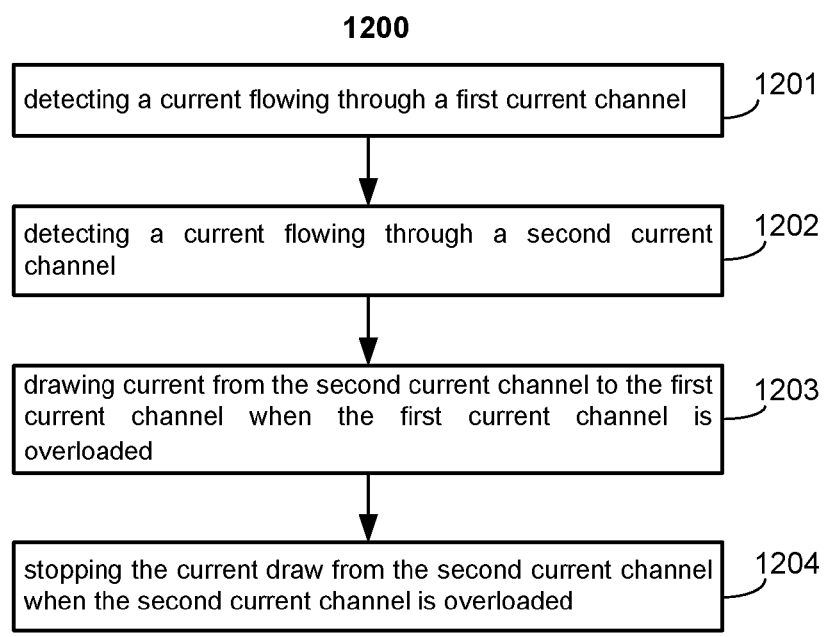
FIG. 12 shows a flowchart of a control method 1200 for current balance in accordance with an embodiment of the present invention.

FIG. 12 shows a flowchart of a control method 1200 for current balance in accordance with an embodiment of the present invention. The control method may be used with power management devices with dual channels, for example, Efuse power devices. The control method 1200 comprises: step 1201, detecting a current flowing through a first current channel; step 1202, detecting a current flowing through a second current channel; step 1203, drawing a current from the second current channel to the first current channel when the first current channel is overloaded; and step 1204, stopping drawing the current from the second current channel when the second current channel is overloaded.

In one embodiment, the step 1203 comprises applying a DC-DC controller to control the current transferred from the second current channel to the first current channel.

In one embodiment, the control method 1200 further comprises step 1205, drawing a current from the first current channel to the second current channel when the second current channel is overloaded; and step 1206, stopping drawing the current from the first current channel when the first current channel is overloaded.

The present invention provides current balance circuits and the method thereof for power management devices. The current balance circuits draw current from a current channel with relatively light load to an overloaded current channel, so as to effectively improve utilization of the power supplies to the power management devices, and to alleviate a power limit of the load circuits to further simplify the design of the load circuits.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A current balance circuit for a power management device having a first current channel and a second current channel, comprising:
   a first terminal coupled to an input terminal of the first current channel;
   a second terminal coupled to an input terminal of the second current channel;
   a third terminal coupled to an output terminal of the first current channel; and
   a fourth terminal coupled to an output terminal of the second current channel;
   a first current sense circuit having an input terminal coupled to the input terminal of the first current channel to detect a current flowing through the first current channel, and an output terminal configured to provide a first current sense signal indicative of the current flowing through the first current channel; wherein
   the current balance circuit draws current from the second current channel to the first current channel based on the first current sense signal.

2. The current balance circuit of claim 1, further comprising:
   a second current sense circuit having an input terminal coupled to the input terminal of the second current channel to detect a current flowing through the second current channel, and an output terminal configured to provide a second current sense signal based on the current flowing through the second current channel;
   a balance control circuit having a first input terminal coupled to the output terminal of the first current sense circuit to receive the first current sense signal, a second input terminal coupled to the output terminal of the second current sense circuit to receive the second current sense signal, and an output terminal configured to provide a first balance control signal indicating a load condition of the first current channel and the second current channel based on the first current sense signal and the second current sense signal; and
   a current regulating circuit having a control terminal coupled to the output terminal of the balance control circuit to receive the first balance control signal, a first terminal coupled to the output terminal of the first current channel, a second terminal coupled to the output terminal of the second current channel, wherein based on the first balance control signal, the current regulating circuit controls a current transferred from the second current channel to the first current channel.

3. The current balance circuit of claim 2, wherein the balance control circuit comprises:
   a first amplify circuit having a first input terminal configured to receive the first current sense signal, a second input terminal configured to receive a first reference signal, and an output terminal configured to provide the first balance control signal based on the first current sense signal and the first reference signal;
   a first comparison circuit having a first input terminal configured to receive the second current sense signal, a second input terminal configured to receive a second reference signal, and an output terminal configured to provide a first discharge control signal based on the second current sense signal and the second reference signal;
   a first capacitor coupled between the output terminal of the first amplify circuit and a ground reference; and
   a first diode having a first terminal coupled to the output terminal of the first amplify circuit to receive the first balance control signal, and a second terminal coupled to the output terminal of the first comparison circuit to receive the first discharge control signal, wherein the first diode is conducted when the first balance control signal is larger than the first discharge control signal.

4. The current balance circuit of claim 2, wherein the balance control circuit comprises:
   a second amplify circuit having a first input terminal configured to receive the first current sense signal, a second input terminal configured to receive a third reference signal, and an output terminal configured to provide the first balance control signal based on the first current sense signal and the third reference signal;
   a first comparison circuit having a first input terminal configured to receive the second current sense signal, a second input terminal configured to receive a second reference signal, and an output terminal configured to provide a first discharge control signal based on the second current sense signal and the second reference signal; and
   a first switch having a control terminal coupled to the output terminal of the first comparison circuit to receive the first discharge control signal, a first terminal coupled to the output terminal of the second amplify circuit, and a second terminal coupled to a ground reference, wherein the first switch is turned on and off by the first discharge control signal.

5. The current balance circuit of claim 2, wherein the current regulating circuit comprises:
   a duty cycle regulating circuit having an input terminal coupled to the output terminal of the balance control circuit to receive the first balance control signal, and an output terminal configured to provide a power control signal based on the first balance control signal; and
   a power circuit having a power switch, wherein the power switch has a control terminal configured to receive the power control signal, a first terminal coupled to the first current channel, and a second terminal coupled to the second current channel; wherein
   the power switch is turned on and off by the power control signal to regulate a current flowing from the second current channel to the first current channel.

6. The current balance circuit of claim 5, wherein the duty cycle regulating circuit comprises a DC-DC controller.

7. The current balance circuit of claim 5, wherein the duty cycle regulating circuit further comprises a current sense terminal configured to receive a current control signal indicative of a current flowing through the power switch, wherein based on the current control signal and the first balance control signal, the duty cycle regulating circuit provides the power control signal at the output terminal.

8. The current balance circuit of claim 7, wherein the duty cycle regulating circuit comprises a PWM (Pulse Width Modulation) circuit with peak current control.

9. The current balance circuit of claim 1, further comprising:
 a second current sense circuit having an input terminal coupled to the input terminal of the second current channel to detect a current flowing through the second current channel, and an output terminal configured to provide a second current sense signal based on the current flowing through the second current channel;
 a balance control circuit having a first input terminal coupled to the output terminal of the first current sense circuit to receive the first current sense signal, a second input terminal coupled to the output terminal of the second current sense circuit to receive the second current sense signal, a first output terminal and a second output terminal configured to respectively provide a first balance control signal and a second balance control signal indicating a load condition of the first current channel and the second current channel based on the first current sense signal and the second current sense signal; and
 a current regulating circuit having a first control terminal coupled to the first output terminal of the balance control circuit to receive the first balance control signal, a second control terminal coupled to the second output terminal of the balance control circuit to receive the second balance control signal, a first terminal coupled to the output terminal of the first current channel, a second terminal coupled to the output terminal of the second current channel, wherein based on the first balance control signal, the current regulating circuit controls a current transferred from the second current channel to the first current channel, and based on the second balance control signal, the current regulating circuit controls a current transferred from the first current channel to the second current channel.

10. The current balance circuit of claim 9, wherein the balance control circuit comprises:
 a first amplify circuit having a first input terminal configured to receive the first current sense signal, a second input terminal configured to receive a first reference signal, and an output terminal configured to provide the first balance control signal based on the first reference signal and the first current sense signal;
 a first comparison circuit having a first input terminal configured to receive the second current sense signal, a second input terminal configured to receive a second reference signal, and an output terminal configured to provide a first discharge control signal based on the second current sense signal and the second reference signal;
 a first capacitor coupled between the output terminal of the first amplify circuit and a ground reference;
 a first diode having a first terminal coupled to the output terminal of the first amplify circuit to receive the first balance control signal, and a second terminal coupled to the output terminal of the first comparison circuit to receive the first discharge control signal, wherein the first diode is conducted when the first balance control signal is larger than the first discharge control signal;
 a third amplify circuit having a first input terminal configured to receive the second current sense signal, a second input terminal configured to receive a fourth reference signal, and an output terminal configured to provide the second balance control signal based on the fourth reference signal and the second current sense signal;
 a second comparison circuit having a first input terminal configured to receive the first current sense signal, a second input terminal configured to receive a fifth reference signal, and an output terminal configured to provide a second discharge control signal based on the first current sense signal and the fifth reference signal;
 a second capacitor coupled between the output terminal of the third amplify circuit and the ground reference; and
 a second diode having a first terminal coupled to the output terminal of the third amplify circuit to receive the second balance control signal, and a second terminal coupled to the output terminal of the second comparison circuit to receive the second discharge control signal, wherein the second diode is conducted when the second balance control signal is larger than the second discharge control signal.

11. The current balance circuit of claim 9, wherein the balance control circuit comprises:
 a second amplify circuit having a first input terminal configured to receive the first current sense signal, a second input terminal configured to receive a third reference signal, and an output terminal configured to provide the first balance control signal based on the first current sense signal and the third reference signal;
 a first comparison circuit having a first input terminal configured to receive the second current sense signal, a second input terminal configured to receive a second reference signal, and an output terminal configured to provide a first discharge control signal based on the second current sense signal and the second reference signal;
 a first switch having a control terminal coupled to the output terminal of the first comparison circuit to receive the first discharge control signal, a first terminal coupled to the output terminal of the second amplify circuit, and a second terminal coupled to a ground reference, wherein the first switch is turned on and off by the first discharge control signal;
 a fourth amplify circuit having a first input terminal configured to receive the second current sense signal, a second input terminal configured to receive a sixth reference signal, and an output terminal configured to provide the second balance control signal based on the second current sense signal and the sixth reference signal;
 a second comparison circuit having a first input terminal configured to receive the first current sense signal, a second input terminal configured to receive a fifth reference signal, and an output terminal configured to provide a second discharge control signal based on the first current sense signal and the fifth reference signal; and
 a second switch having a control terminal coupled to the output terminal of the second comparison circuit to receive the second discharge control signal, a first terminal coupled to the output terminal of the fourth amplify circuit, and a second terminal coupled to the ground reference, wherein the second switch is turned on and off by the second discharge control signal.

12. The current balance circuit of claim 9, wherein the current regulating circuit comprises:

a select circuit having a control terminal configured to receive a select signal relative to current of the first current channel and the second current channel, a first input terminal configured to receive the first balance control signal, a second input terminal configured to receive the second balance control signal, and an output terminal configured to provide the first balance control signal or the second balance control signal as a balance control signal according to the select signal;

a duty cycle regulating circuit having an input terminal coupled to the output terminal of the select circuit to receive the balance control signal, and an output terminal configured to provide a power control signal based on the balance control signal; and a power circuit having a power switch, wherein the power switch has a control terminal configured to receive the power control signal, a first terminal coupled to the first current channel, and a second terminal coupled to the second current channel; wherein the power switch is turned on and off by the power control signal to regulate a current transferred between the first current channel and the second current channel.

13. The current balance circuit of claim 12, wherein the power circuit comprises a bidirectional switching regulator.

14. An Efuse power device comprising a first current channel, a second current channel, and a current balance circuit, wherein each current channel comprises an Efuse unit, and wherein the current balance circuit comprises:

a first current sense circuit having an input terminal coupled to an input terminal of the first current channel to detect a current flowing through the first current channel, and an output terminal configured to provide a first current sense signal indicative of the current flowing through the first current channel;

a second current sense circuit having an input terminal coupled to an input terminal of the second current channel to detect a current flowing through the second current channel, and an output terminal configured to provide a second current sense signal indicative of the current flowing through the second current channel;

a balance control circuit having a first input terminal coupled to the output terminal of the first current sense circuit to receive the first current sense signal, a second input terminal coupled to the output terminal of the second current sense circuit to receive the second current sense signal, and an output terminal configured to provide a first balance control signal indicating a load condition of the first current channel and the second current channel based on the first current sense signal and the second current sense signal;

a buck converter having a power switch, wherein the power switch has a control terminal configured to receive a power control signal, a first terminal coupled to the output terminal of the first current channel, and a second terminal coupled to the output terminal of the second current channel; and a PWM circuit having an input terminal coupled to the balance control circuit to receive the first balance control signal, a current sense terminal configured to receive a current control signal indicative of a current flowing through the power switch of the buck converter, and an output terminal configured to provide the power control signal based on the first balance control signal and the current control signal; wherein the power switch of the buck converter is turned on and off by the power control signal to regulate a current flowing from the second current channel to the first current channel.

15. A control method used with a power management device having dual current channel, comprising:

detecting a current flowing through a first current channel;

detecting a current flowing through a second current channel;

drawing a current from the second current channel to the first current channel when the first current channel is overloaded; and stopping drawing the current from the second current channel when the second current channel is overloaded.

16. The control method of claim 15, further comprises:

drawing a current from the first current channel to the second current channel when the second current channel is overloaded; and stopping drawing current from the first current channel when the first current channel is overloaded.

* * * * *